US012604705B2

(12) United States Patent
    Cho

(10) Patent No.: US 12,604,705 B2
(45) Date of Patent: Apr. 14, 2026

(54) CERAMIC SUSCEPTOR

(71) Applicant: MiCo Ceramics Ltd., Anseong-si (KR)

(72) Inventor: Hyung-Jun Cho, Anseong-si (KR)

(73) Assignee: MiCo Ceramics Ltd., Anseong-si (KR)

( * ) Notice: Subject to any disclaimer, the term of this patent is extended or adjusted under 35 U.S.C. 154(b) by 0 days.

(21) Appl. No.: 19/066,264

(22) Filed: Feb. 28, 2025

(65) Prior Publication Data

US 2025/0285910 A1    Sep. 11, 2025

(30) Foreign Application Priority Data

Mar. 5, 2024    (KR) ........................ 10-2024-0031493

(51) Int. Cl.
    H01L 21/687 (2006.01)
    H05B 3/03 (2006.01)
    H05B 3/14 (2006.01)

(52) U.S. Cl.
    CPC .. H01L 21/68785 (2013.01); H01L 21/68792 (2013.01); H05B 3/03 (2013.01); H05B 3/143 (2013.01)

(58) Field of Classification Search
    None
    See application file for complete search history.

(56) References Cited

U.S. PATENT DOCUMENTS 10,147,610 B1    12/2018    Lingampalli et al.
2011/0064885 A1    3/2011    Suzuki et al.

2015/0194326 A1 *    7/2015    Zhou .................. H01L 21/68792
                                                        156/345.48
2020/0312696 A1    10/2020    Unno et al.
2022/0223438 A1 *    7/2022    Komatsu .............. C23C 16/458
2022/0238316 A1    7/2022    Lee et al.
2023/0247727 A1    8/2023    Jin
2023/0326779 A1    10/2023    Jung et al.

FOREIGN PATENT DOCUMENTS

KR    20050088159 A    9/2005
KR    4386606 B2    12/2009
KR    101305760 B1    9/2013
KR    20160133374 A    11/2016
KR    20180008740 A    1/2018
KR    20200088500 A    7/2020
KR    20220001870 A    1/2022
WO    9956307 A1    4/1999

* cited by examiner

*Primary Examiner* — Edward F Landrum
*Assistant Examiner* — Theodore J Evangelista
(74) *Attorney, Agent, or Firm* — NKL LAW; Jae Youn Kim

(57) ABSTRACT

Disclosed is a ceramic susceptor. The ceramic susceptor may include: an insulating plate in which one or more electrodes are arranged; a hollow shaft with one end connected to the insulating plate; and one or more electrode rods connected to the electrodes. The hollow shaft may include one or more side wall holes penetrating an interior of a side wall, and the one or more electrode rods may include one or more first electrode rods, each of which is electrically connected to a first electrode among the one or more electrodes. The first electrode rods may extend through the side wall holes, respectively.

12 Claims, 9 Drawing Sheets

Fig. 5B

CERAMIC SUSCEPTOR

CROSS-REFERENCE TO RELATED APPLICATION(S)

This application is based on and claims priority under 35 U.S.C. 119 to Korean Patent Application No. 10-2024-0031493, filed on Mar. 5, 2024, in the Korean Intellectual Property Office, the disclosure of which is herein incorporated by reference in its entirety.

BACKGROUND OF THE INVENTION

1. Field of the Invention

The present disclosure relates to a ceramic susceptor, and more particularly, to a ceramic susceptor in which an electrode rod is arranged within the side wall of a hollow shaft.

2. Description of the Prior Art

In general, a semiconductor device or a display device is manufactured by sequentially laminating multiple thin film layers including a dielectric layer and a metal layer on a glass substrate, a flexible substrate, or a semiconductor wafer substrate and then patterning the thin film layers. These thin film layers are sequentially deposited on the substrate through a chemical vapor deposition (CVD) process or a physical vapor deposition (PVD) process. The CVD process includes a low-pressure CVD (LPCVD) process, a plasma-enhanced CVD (PECVD) process, a metal-organic CVD (MOCVD) process, and the like.

Such CVD and PVD apparatuses are equipped with a ceramic susceptor for supporting glass substrates, flexible substrates, semiconductor wafer substrates, and the like, and for heat treatment or the like. The ceramic susceptor may be installed in the CVD and PVD apparatuses to be used for substrate heating during processes such as heat treatment. In addition, the ceramic susceptor may include a radio frequency (RF) electrode and may also be used to form plasma in processes such as an etching process of thin film layers formed on a semiconductor wafer substrate.

FIG. 1 is a schematic cross-sectional view of a conventional ceramic susceptor 1.

As illustrated in FIG. 1, a conventional ceramic susceptor 1 includes an insulating plate 10 coupled to a shaft 20. The insulating plate 10 includes electrodes 12 or heating elements 14 arranged between ceramic materials. The shaft 20 is of a hollow type, providing a through-hole that allows for rods 21, 22, and 23 to pass therethrough. The rods are respectively connected to the electrodes 12 or heating elements 14 to supply power.

However, in the structure of the conventional ceramic susceptor 1 as illustrated in FIG. 1, since the power supply rods 21, 22, and 23 are arranged within the through-hole of the hollow shaft 20, the rods 21, 22, and 23 are prone to move or shake within the relatively large through-hole. This may cause the rods 21, 22, and 23 to physically bend or short-circuit.

In addition, in order to prevent arcing caused by electrical contact, it is necessary to insulate the rods 21, 22, and 23 from each other within the same space in the through-hole of the shaft 20. To this end, the rods 21, 22, and 23 are wrapped and insulated with separate insulators made of a material such as $Al_2O_3$. However, since the insulators are coated in the form of a pipe, the spacing between the rods becomes narrower, and if not coated, arcing may be caused.

In addition, from a design perspective, the metal rods 21, 22, and 23 are densely packed in the center of the through-hole in the shaft 20. Therefore, when it is necessary to change the number or positions of the rods depending on the situation, there are limitations in changing the number or positions of the rods due to the spatial constraints within the through-hole of the shaft 20.

SUMMARY OF THE INVENTION

Accordingly, the present disclosure has been made to solve the aforementioned problems, and provides a ceramic susceptor in which electrode rods are arranged in side wall holes (e.g., Φ3 to Φ6) of a hollow shaft to eliminate the space in which the electrodes may move or bend, thereby making it easier to prevent the risk of physical short circuits.

In addition, the present disclosure provides a ceramic susceptor in which electrode rods may be arranged within the hollow of a hollow shaft, but arrangement of more electrode rods is possible without arranging electrode rods within the hollow, and in which free design of electrode arrangement is possible depending on changes in the number or positions of electrode rods.

Furthermore, the present disclosure provides a ceramic susceptor in which by arranging electrode rods in side wall holes (e.g., Φ3 to Φ6) of a hollow shaft, the insulation of a hollow shaft is utilized so that a separate insulator coating for insulating each electrode rod is unnecessary, and in which the radio frequency electrode rods and electrode rods for a heater are separately arranged in the side wall holes of the hollow shaft or are divisionally arranged in the side wall holes and the hollow shaft, ensuring that the gap between the rods does not become narrow, thereby preventing the occurrence of arcing.

In summary, in view of the foregoing, a ceramic susceptor according to an aspect of the present disclosure may include: an insulating plate in which one or more electrodes are arranged; a hollow shaft with one end connected to the insulating plate; and one or more electrode rods connected to the electrodes. The hollow shaft may include one or more side wall holes penetrating an interior of a side wall, and the one or more electrode rods may include one or more first electrode rods, each of which is electrically connected to a first electrode among the one or more electrodes. The first electrode rods may extend through the side wall holes, respectively.

The one or more electrode rods further include one or more second electrode rods, each of which is connected to a second electrode among the one or more electrodes. The one or more second electrode rods may extend through a hollow of the hollow shaft.

The first electrodes may each include a heater electrode, and the second electrodes may each include a radio frequency electrode. At this time, multiple first electrode rods may be respectively connected to terminals of the heater electrodes.

The first electrodes may each include a radio frequency electrode, and the second electrodes may each include a heater electrode. At this time, multiple first electrode rods may be respectively connected to terminals of the heater electrodes.

The electrode rods may each include a gas flow path, and one or more gas holes in communication with the gas flow path.

The ceramic susceptor may further include a conductive socket coupled to the electrode rods and configured to supply power, and the conductive socket may include a gas supply flow path configured to communicate with the gas flow path.

The ceramic susceptor may further include a mount coupled to the lower portion of the hollow shaft, and a sealing member coupled between the hollow shaft and the mount.

The hollow shaft may include a groove formed on a surface coupled to the mount and extending to meet the side wall holes at least once, the mount may include a gas supply flow path configured to communicate with the groove, and the one or more first electrode rods may pass through the groove.

The one or more electrode rods may further include one or more second electrode rods, each of which is connected to a second electrode among the one or more electrodes, the one or more electrode rods extending through a hollow of the hollow shaft, and the one or more second electrode rods may pass through the mount.

The sealing member may be a ring structure, the ring-shaped sealing member may include a rectangular, circular, oval, or trapezoidal cross-sectional shape, and the sealing member may be made of a silicone material.

According to the ceramic susceptor of the present disclosure, by arranging the electrode rods in the side wall holes (e.g., Φ3 to Φ6) of the hollow shaft, the space in which the electrodes shake or bend is eliminated, which makes it easy to prevent the risk of physical short circuits.

In addition, the arrangement of the electrode rods inside the hollow of the hollow shaft may be combined with the arrangement of the electrode rods in the side wall holes (e.g., Φ3 to Φ6) of the hollow shaft, allowing for flexible design of electrode arrangement depending on changes in the number or positions of the electrode rods, and enabling the arrangement of more electrode rods.

Furthermore, by arranging electrode rods in the side wall holes (e.g., Φ3 to Φ6) of the hollow shaft, the insulation of the hollow shaft is utilized so that a separate insulator coating for insulating each electrode rod is unnecessary. In addition, the radio frequency electrode rods and electrode rods for a heater are separately arranged in the side wall holes of the hollow shaft or are divisionally arranged in the side wall holes and the hollow shaft, ensuring that the gap between the rods does not become narrow, thereby preventing the occurrence of arcing.

BRIEF DESCRIPTION OF THE DRAWINGS

The above and other aspects, features and advantages of the present disclosure will be more apparent from the following detailed description taken in conjunction with the accompanying drawings, in which:

FIG. 5B is a view of a surface C-D of the hollow shaft to which the mount is coupled, as seen from below in FIG. 5A.

DETAILED DESCRIPTION OF THE EXEMPLARY EMBODIMENTS

Figure 1:
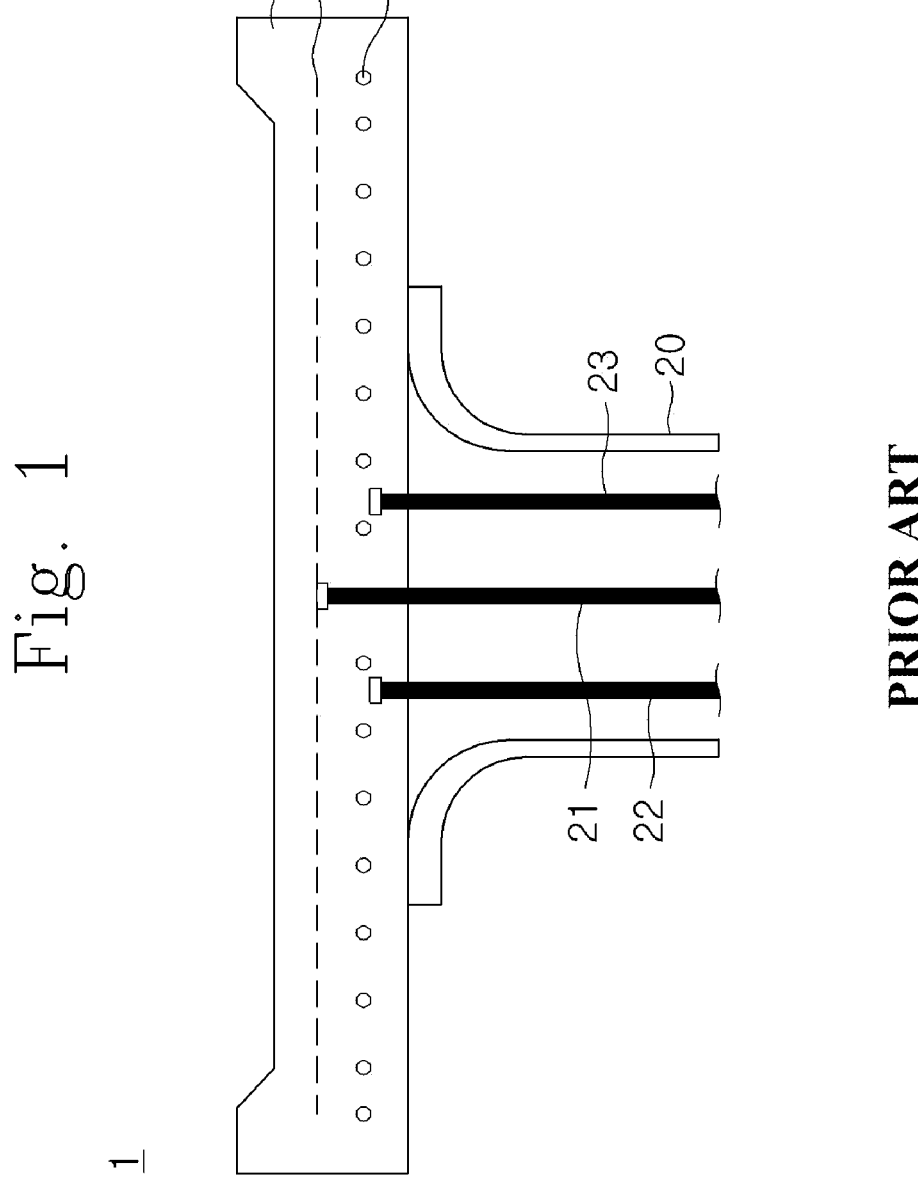
FIG. 1 is a schematic cross-sectional view of a conventional ceramic susceptor.

Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not entirely reflect the actual size. Therefore, the descriptions provided herein are not limited by the relative sizes or spacings of the components drawn in each drawing.

In describing the embodiments of the present disclosure, when a detailed description of the known technology related to the present disclosure is determined to unnecessarily obscure the subject matter of the present disclosure, the detailed description will be omitted. In addition, terms to be described later are defined in consideration of functions in the present disclosure, and may vary according to the intention, custom, or the like of a user or operator. Therefore, the definitions of the terms should be made based on the description throughout this specification. Terms used in the detailed description are only for describing the embodiments of the present disclosure, and should not be construed as limiting in any way. Unless expressly used otherwise, singular expressions include the meanings of plural expressions. As used herein, expressions such as "including" or "comprising" are intended to indicate any features, numbers, steps, operations, elements, or some or combinations thereof, and should not be construed to exclude the existence or possibility of one or more other features, numbers, steps, operations, elements, or some or combinations thereof, in addition to those described above.

In addition, terms such as "first" and "second" may be used to describe various components, but the components are not limited by the terms, and these terms are only used for the purpose of distinguishing one component from another.

First, as described below, a ceramic susceptor 100, 200, or 300 of the present disclosure may be installed in a chamber of a CVD apparatus or a PVD apparatus to be used for heating using heating elements (electrodes 114) and/or supporting a substrate 11 using a (radio frequency) electrode 112, or in processes such as plasma-enhanced chemical vapor deposition or dry etching using plasma. The ceramic susceptor 100, 200, or 300 of the present disclosure may further include a chuck electrode (not illustrated) arranged at a predetermined distance from the electrode 112 to enable chucking and de-chucking of the substrate 11. In some cases, the electrode 112 may be a radio frequency electrode arranged to receive power for plasma generation as described above, but may also function as an electrostatic chuck electrode (or chuck electrode) arranged to receive power for chucking and de-chucking the substrate 11. The substrate 11 may be a processing target substrate for various applications, such as a semiconductor wafer, a glass substrate, or a flexible substrate.

Accordingly, the insulating plate 110 may be configured to stably support a processing target substrate while enabling various semiconductor processes such as heating using the heating element 114 and/or plasma-enhanced chemical vapor deposition or plasma dry etching using the electrode 112.

Figure 2:
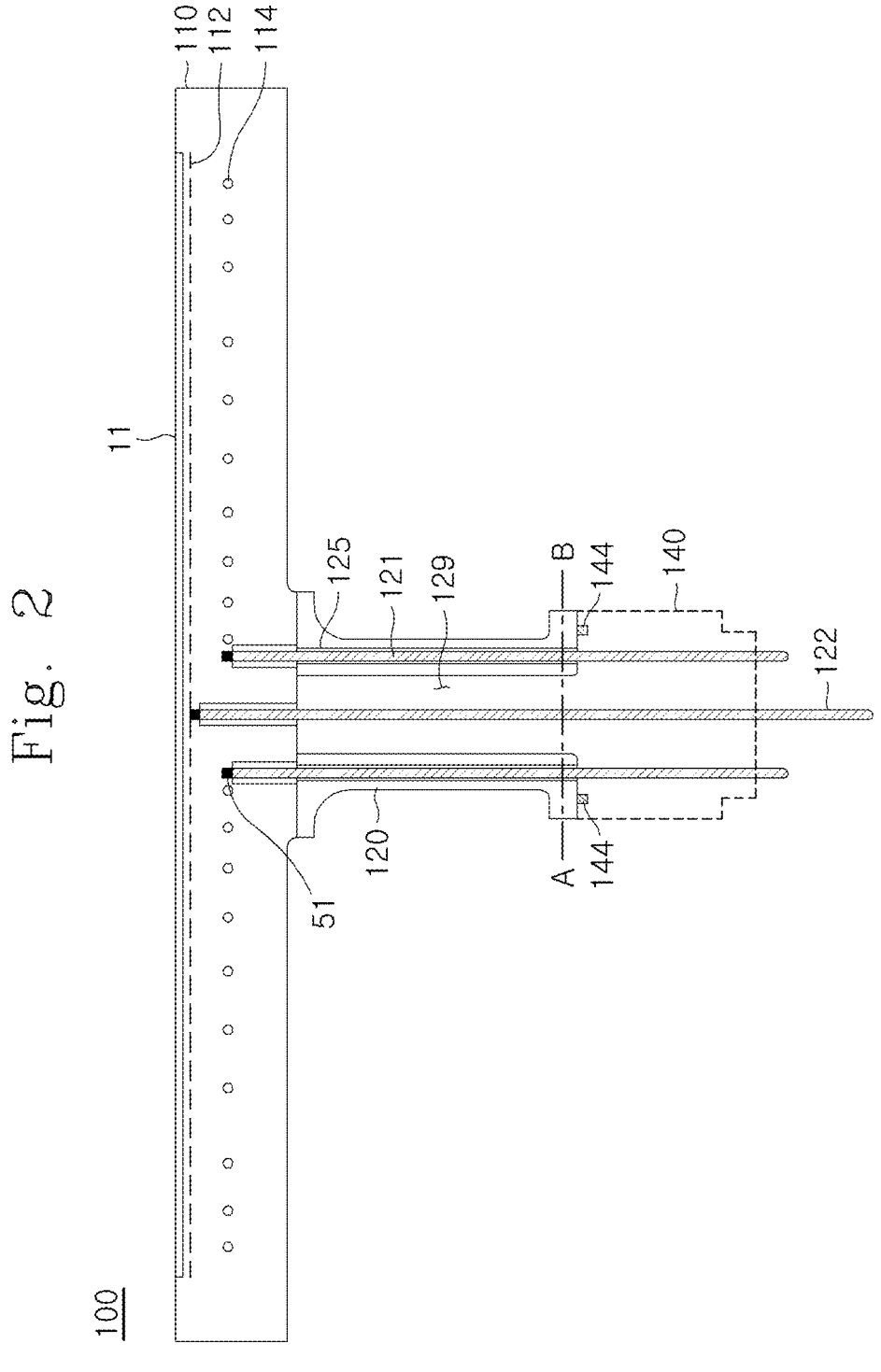
FIG. 2 is a schematic cross-sectional view of a ceramic susceptor according to an embodiment of the present disclosure.

FIG. 2 is a schematic cross-sectional view of a (ceramic) susceptor 100 according to an embodiment of the present disclosure.

Referring to FIG. 2, a (ceramic) susceptor 100 according to an embodiment of the present disclosure may include an insulating plate 110 made of a ceramic material, a hollow shaft 120 having a hollow 129, and may further include a mount 140 as needed. The insulating plate 110, the shaft 120, and the mount 140 may be sequentially connected, and a sealing member 144 with a ring structure may be provided between the shaft 120 and the mount 140. The sealing member 144 may be configured to seal the surfaces where the lower portion of the hollow shaft 120 and the mount 140 are coupled.

According to an embodiment of the present disclosure, the ceramic susceptor 100 has electrode rods 121 arranged in side wall holes 125 (e.g., $\Phi 3$ to $\Phi 6$) of the hollow shaft 120, the spaces in which the electrode rods 121 may move or bend are eliminated, thereby facilitating prevention of the risk of physical short circuits. In addition, an electrode rod 122, penetrating through the hollow 129 of the hollow shaft 120, may further be arranged. The electrode rods 121 may be connected to the electrodes 112 or 114, and if needed, the electrode rod 122 may also be connected to the electrodes 112 or 114.

To this end, the insulating plate 110 may be configured such that one or more heating elements or electrodes 114 are arranged (embedded) between the ceramic materials, and in some cases, the insulating plate 110 may be further configured such that one or more other electrodes 112 are arranged (embedded) at a predetermined distance from the heating elements 114. The insulating plate 110 is configured to stably support a processing target substrate 11 while enabling various semiconductor processes, such as heating using the heating element 114 and/or supporting the substrate, plasma-enhanced chemical vapor deposition, or plasma dry etching using the electrode 112. The insulating plate 110 may be a plate-like structure having a predetermined shape. For example, the insulating plate 110 may be a circular plate-like structure, but is not necessarily limited thereto. Here, the ceramic material may be at least one of $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, the powder of the ceramic material may be molded and sintered to provide the insulating plate 110, and each ceramic powder for this purpose may optionally contain about 0.1 to 10%, preferably about 1 to 5% of yttrium oxide powder.

In addition, the heating element 114 may formed in a planar coil shape or a flat plate shape using a heating wire (or resistance wire). In addition, the heating element 114 may be fabricated in a multi-layer structure for precise temperature control. The heating element 114 may be connected to a power source for a separate heating element 114 via connection rods 121 and 122 for power supply. The heating element may perform the function of heating a processing target substrate 11 on the insulating plate 110 to a predetermined temperature for substrate heating, vapor deposition, etching, and the like in a semiconductor process. The connection rods 121 and 122 may pass through the hollow 129 of the shaft 120 or the side wall through-holes (side wall holes) 125, and may extend to the outside through the mount 140.

The electrode 112 (including a chuck electrode) may be made of tungsten (W), molybdenum (Mo), silver (Ag), gold (Au), niobium (Nb), titanium (Ti), aluminum nitride (AlN), or an alloy thereof, preferably molybdenum (Mo). The electrode 112 may be connected to a power terminal (e.g., a ground) via another connection rod (not illustrated). The connection rods 121 and 122 may pass through the hollow 129 of the shaft 120 or the side wall through-holes (side wall holes) 125, and may extend to the outside through the mount 140. For example, the electrode 112 may be used as a chuck electrode for an electrostatic chuck function to support a substrate 11 placed on the insulating plate 110 or as a plasma-generating electrode for plasma generation functions in processes such as plasma-enhanced chemical vapor deposition or dry etching in reactive ion etch (RIE) equipment.

The connection rods 121 and 122 may be bonded to electrode pads 51 through brazing. The electrode pads 51 may also be joined to the electrodes 112 and 114 of the insulating plate 110 through brazing. For example, for the brazing, each joint may be formed by injecting a conductive filler, heating at a high temperature, and cooling.

The shaft 120 has a pipe shape with a hollow 129, and one end is joined to the bottom surface of the insulating plate 110. The shaft 120 may be made of the same ceramic material as the insulating plate 110 and coupled to the same. Here, the ceramic material may be at least one of $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, the powder of the ceramic material may be molded and sintered to provide the shaft 120, and each ceramic powder for this purpose may optionally contain about 0.1 to 10%, preferably about 1 to 5% of yttrium oxide powder. The shaft 120 may be joined to the insulating plate 110 using a bonding material such as ceramic paste. In some cases, the shaft 120 may be mechanically coupled to the insulating plate 110 by using bolts, nuts, and the like.

FIGS. 3A to 3D are cross-sectional views taken along line A-B in FIG. 2, illustrating embodiments in each of which multiple electrode rods 121 are arranged in side wall holes 125 of the shaft 120.

Referring to FIGS. 3A to 3D, the shaft 120 may include one or more side wall holes 125 penetrating the side wall, and electrode rods 121 may be respectively arranged in the side wall holes 125 of the shaft 120. That is, one or more electrode rods 121 are connected to one or more electrodes 112 or 114 and arranged to extend through respective side wall holes 125. In addition, one or more electrode rods 122 may be connected to the one or more electrodes 112 or 114 and arranged to extend through the hollow 129 from the opposite side of the shaft 120. Any one of the electrode rods 121 and 122 may be omitted. In other words, only the electrode rods 121 may be arranged in the side wall holes 125.

Accordingly, each connection rod 121 or 122 extends through the hollow 129 of the shaft 120 or through each side wall hole 125. Furthermore, when a mount 140 is provided, each connection rod 121 or 122 may extend to the outside further through the mount 140.

For example, preferably, among the one or more electrodes 112 and 114, a first electrode 112 may be a radio frequency electrode as described above, and a second electrode 114 may be a heater electrode, such as the above-described heating element. Conversely, among the one or more electrodes 112 and 114, the first electrode 112 may be a heater electrode, such as the above-described heating element, and the second electrode 114 may be a radio frequency electrode as described above.

Figure 3A:
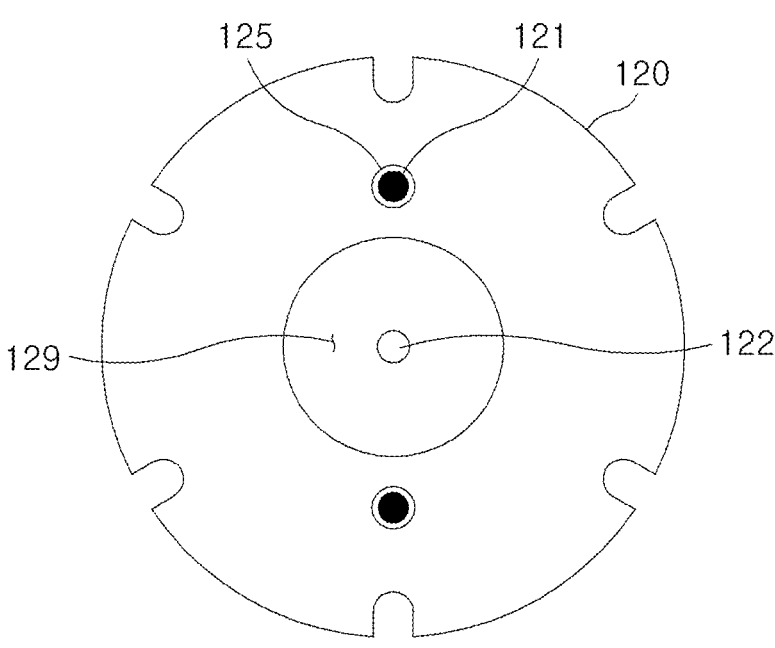
FIGS. 3A to 3D are cross-sectional views taken along line A-B in FIG. 2, illustrating embodiments in each of which multiple electrode rods are respectively arranged in side wall holes of the shaft.

For example, FIG. 3A may illustrate two electrode rods 121 arranged for a single-zone heating element (heater electrode). Specifically, a pair of heating elements (heater electrodes) 121 may preferably be connected to opposite terminals (not illustrated) of the second electrode 114, which serves as a heater electrode. This corresponds to a case where the heating element (pattern) of the second electrode 114, which is a heater electrode, is electrically connected between the two opposite terminals (not illustrated) without interruption, thereby forming a single zone and generating heat. At this time, one or more first electrodes 112, which are radio frequency electrodes, may be connected to one or more electrode rods 122, respectively.

Figure 3B:
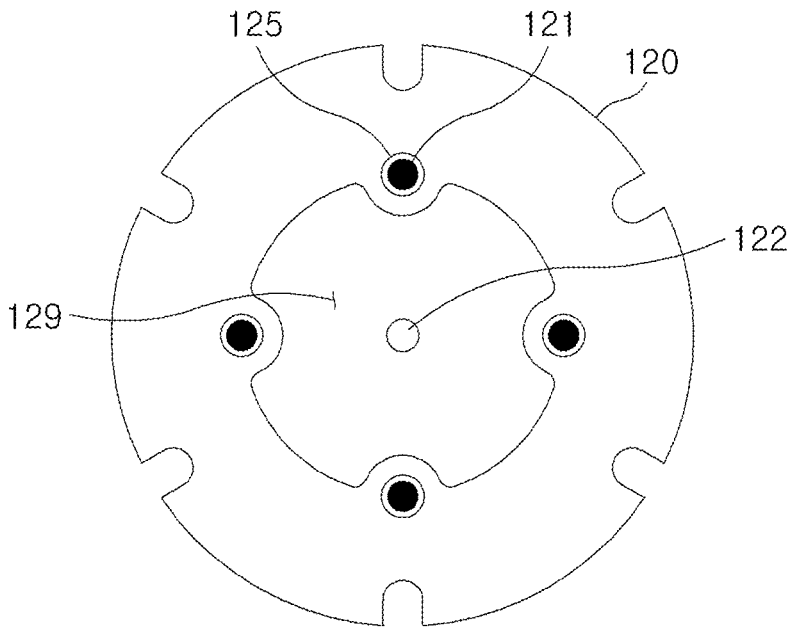
Figure 3C:
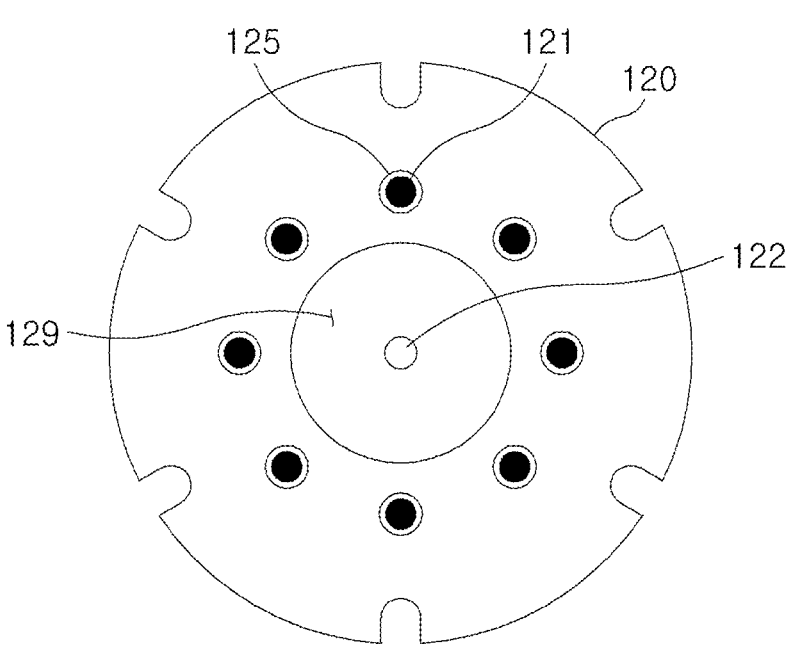
Figure 3D:
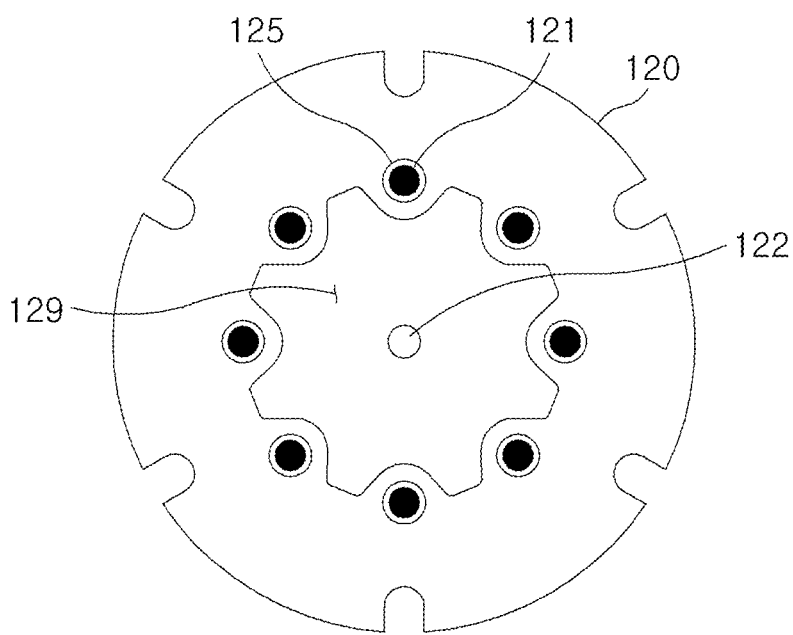

In addition, as described above, the functions of the first electrode 112 and the second electrode 114 may be interchanged. The configuration, where the electrode rods 121 and 122 are interchanged for opposite functions, may be applied as needed. Furthermore, the inner surface of the side wall of the shaft 120 may be a plain form with no protrusions, as illustrated in FIGS. 3A and 3C, or it may have an uneven form with protrusions, as illustrated in FIGS. 3B and 3D. In the case of FIGS. 3B and 3D, one side wall hole 125 for an electrode rod 121 or 122 may be arranged in each of radially inward convex portions. Such an uneven form of the inner surface of the side wall of the shaft 120 may make it easy to distinguish the positions where the electrode rods 121 and 122 are arranged and is advantageous in ensuring the internal space of the hollow 129 of the shaft 120, thereby allowing for more flexible arrangement of structures, such as the rods 122 placed inside.

In addition, FIG. 3B may illustrate four electrode rods 121 for the arrangement of two-zone heating elements (heater electrodes). That is, two of the four electrode rods 121 may be connected to a first pair of terminals (not illustrated) of the second electrode 114 as the heater electrode, and a heating element electrode (pattern) electrically extending without interruption between the first pair of terminals (not illustrated) may form a first zone. The remaining two of the four electrode rods 121 may be connected to a second pair of terminals (not illustrated) of the second electrode 114 as the heater electrode, and a heating element electrode (pattern) electrically extending without interruption between the second pair of terminals (not illustrated) may form a second zone. At this time, one or more first electrodes 112, which are radio frequency electrodes, may be connected to one or more electrode rods 122, respectively.

In a manner similar to that illustrated in FIG. 3A or FIG. 3B, as illustrated in FIGS. 3C and 3D, eight electrode rods 121, grouped in pairs, may be connected to the respective terminal pairs of four heating element electrodes (patterns) included in the second electrode 114 as the heater electrode, thereby forming four heating zones. Here, one or more first electrodes 112, which are radio frequency electrodes, may also be connected to one or more electrode rods 122, respectively.

Figure 4A:
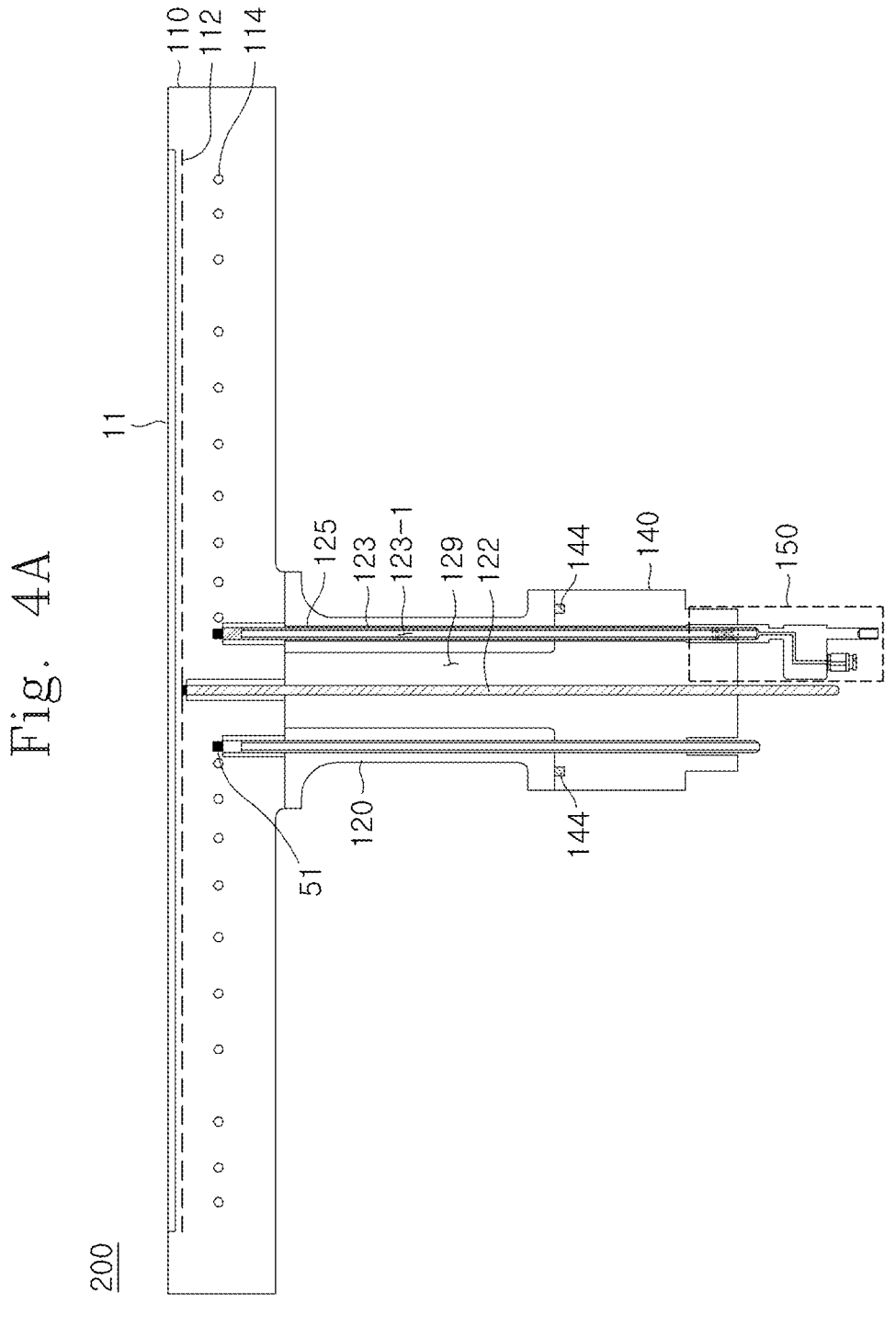
FIG. 4A is a cross-sectional view illustrating a ceramic susceptor according to another embodiment of the present disclosure.
Figure 4B:
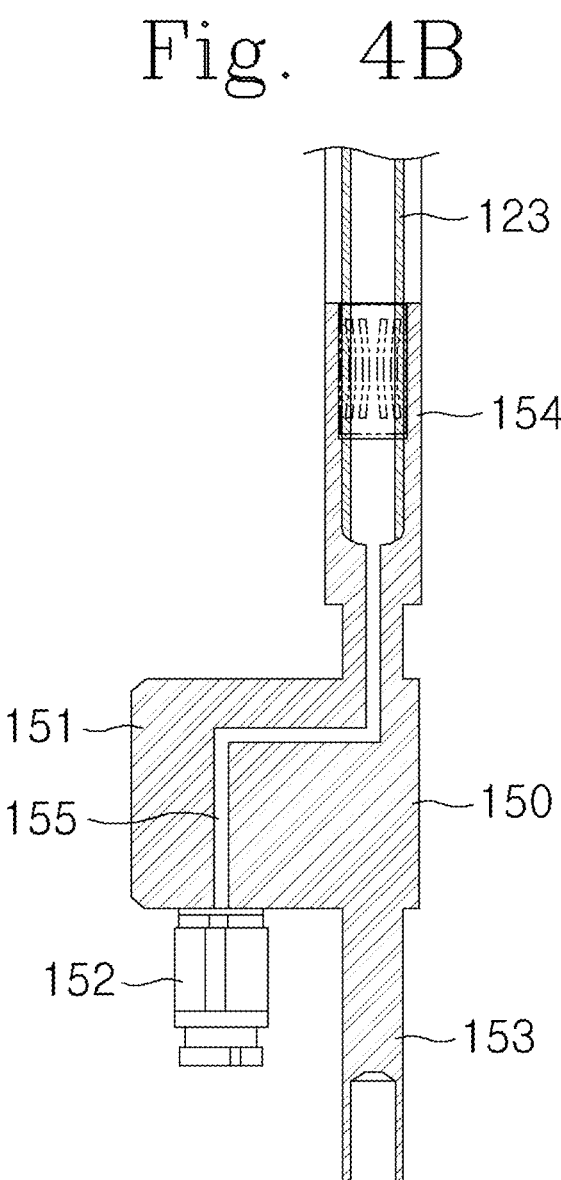
FIG. 4B is an enlarged view of a power supply conductor socket in FIG. 4A.

FIG. 4A is a cross-sectional view illustrating a ceramic susceptor 200 according to another embodiment of the present disclosure. FIG. 4B is an enlarged view of a power supply conductor socket 150 in FIG. 4A.

Figure 4C:
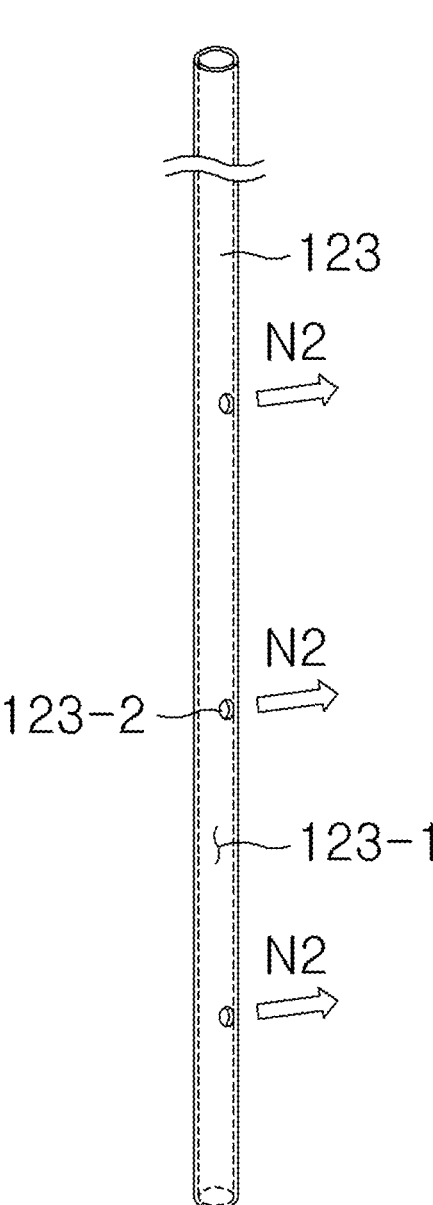
FIG. 4C is an enlarged view of an electrode rod having a gas flow path and gas hole(s) in FIG. 4A.

FIG. 4C is an enlarged view of an electrode rod 123 having a gas flow path 123-1 and gas holes 123-2 in FIG. 4A.

Referring to FIGS. 4A to 4C, the ceramic susceptor 200 is a modification of the ceramic susceptor 100 of FIG. 2. The ceramic susceptor 200 includes a power supply conductor socket 150 and an electrode rod 123 arranged within a side wall hole 125 and coupled to the power supply conductor socket. The ceramic susceptor 200 may include the power supply conductor socket 150 and the electrode rod 123 in addition to the ceramic susceptor 100 of FIG. 2. In some cases, the ceramic susceptor 200 may include the power supply conductor socket 150 and the electrode rod 123 in place of the electrode rod 121 in the side wall hole 125 of the ceramic susceptor 100 of FIG. 2.

First, in FIG. 4A, each electrode rod 121 or 122, which supplies power to the electrode 112 or 114, may be accommodated in the hollow 129 or a side wall hole 125 of the shaft 120, may extend to the outside through the mount 140.

In addition, as illustrated in FIG. 4A, the mount 140 is connected to the longitudinal end of the shaft 120. The mount 140 may be mechanically coupled to the longitudinal end of the shaft 120. The connection between the shaft 120 and the mount 140 may be made by mechanical coupling using bolts, nuts, or the like. At this time, a sealing member 144 may be provided between the lower portion of the hollow shaft 120 and the mount 140 for sealing. The sealing member 144 may be a ring-shaped member for sealing the surfaces where the lower portion of the hollow shaft 120 and the mount 140 are coupled, and its cross-sectional shape may take various forms, such as rectangular, trapezoidal, circular, or elliptical. Preferably, the sealing member 144 is made of silicone material. For example, a predetermined groove may be provided on the upper portion of the mount 140 in advance radially outward from the side wall hole 125 to accommodate the sealing member 144. The sealing member 144 may be placed higher than the predetermined groove and then compressed by the aforementioned mechanical coupling, thereby sealing the surfaces where the lower portion of the shaft 120 and the mount 140 are coupled.

The aforementioned connection mount 140 may be made of a ceramic material as described above. In some cases, the mount 140 may be made of a metallic material such as aluminum (Al), and in such cases, it is desirable to insulate the necessary portions through which the connection rods 121 or 122 pass. The ceramic material may be at least one of $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, the powder of the ceramic material may be molded and sintered to provide the shaft 120, and each ceramic powder for this purpose may optionally contain about 0.1 to 10 wt. %, preferably about 1 to 5 wt. %, of yttrium oxide powder.

In FIG. 4B, the conductor socket 150 may be made of a conductor such as gold, silver, copper, or nickel, and may include a body 151, and a gas connection portion 152, a power connection portion 153, and a rod connection portion 154, which are either coupled to or integrated with the body 151.

As illustrated in FIG. 4C, the electrode rod 123 may have a form in which a gas flow path 123-1 is provided longitudinally as an empty space inside the electrode rod, and one or more gas holes 123-2 may be formed on the side surface of the electrode rod to communicate with the gas flow path 123-1.

The electrode rod 123 is coupled to the rod connection portion 154 of the conductor socket 150, and the gas flow path 123-1 may be provided from the end of the rod connection portion 154 side of the electrode rod 123 by a predetermined length toward the insulating plate 110 side or to the end on the insulating plate 110 side. Multiple gas holes 123-2 may be provided in a straight line along the side surface of the electrode rod 123 at predetermined intervals, but in some cases, they may not be provided in a straight line and may be provided at different intervals.

The conductor socket 150 is configured to supply power for a heater, power for a radio frequency electrode, or power for a chuck electrode from a power line connected to the power connection portion 153 to the electrode rod 123 coupled to the rod connection portion 154. In addition, the conductor socket may also provide an inert gas (e.g., He or $N_2$) to the electrode rod 123 through the gas supply flow path 155 between the gas connection portion 152 and the rod connection portion 154.

A gas tube for providing an inert gas (e.g., He or $N_2$) may be coupled to the gas connection portion 152, and the gas supplied to the electrode rod 123 through the gas supply flow path 155, which communicates with the gas tube, may flow along the gas flow path 123-1, which communicates with the gas supply flow path 155, and may be supplied to the side wall hole 125 through the gas hole(s) 123-2. The provision of such an inert gas to the side wall hole 125 has the effect of preventing the oxidation of the electrode rod 123 even in a high-temperature environment when performing a necessary semiconductor process while supporting a target substrate 11 on the insulating plate 110.

Figure 5A:
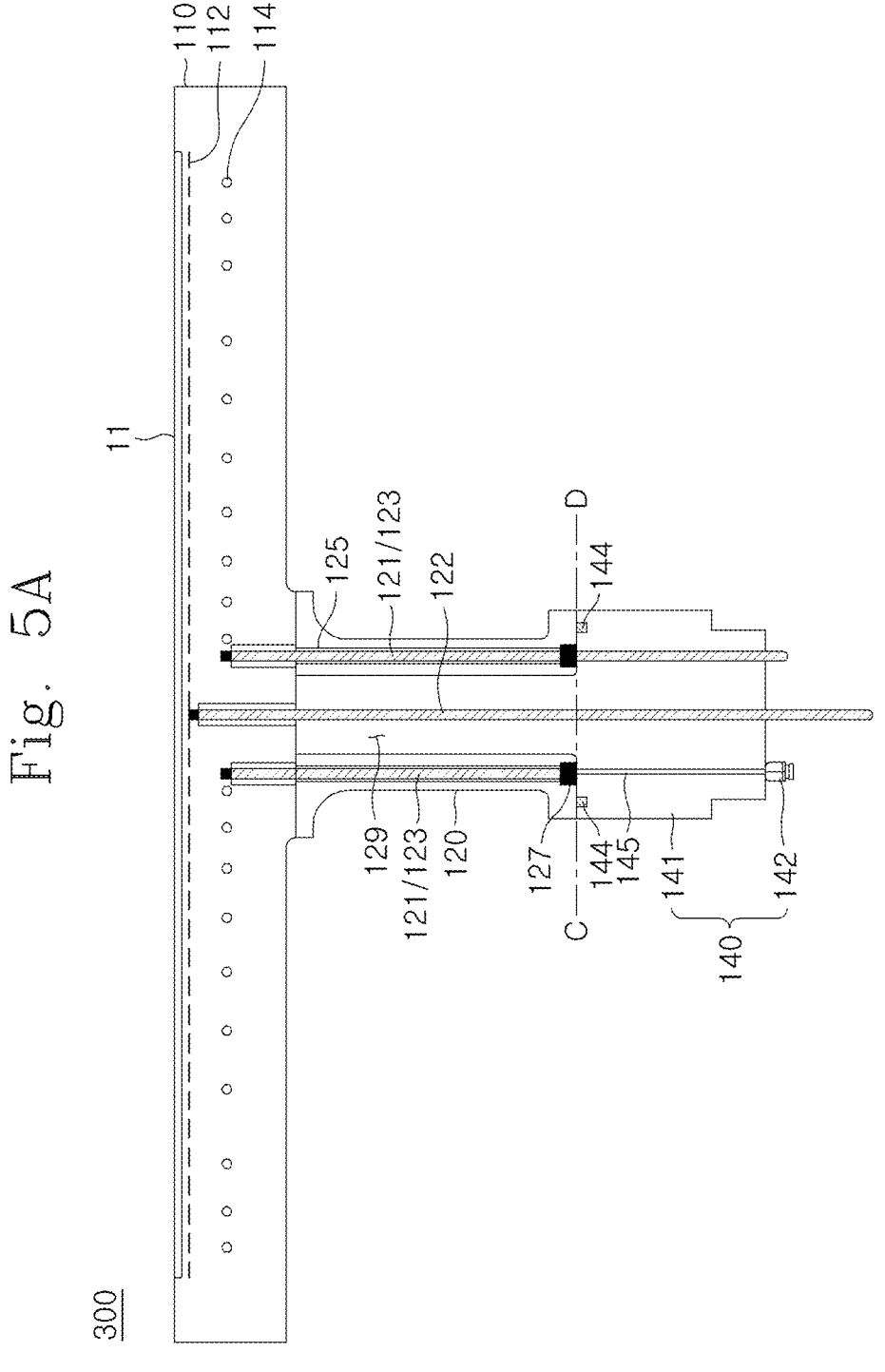
FIG. 5A is a cross-sectional view illustrating a ceramic susceptor according to yet another embodiment of the present disclosure.

FIG. 5A is a cross-sectional view illustrating a ceramic susceptor 300 according to yet another embodiment of the present disclosure.

Referring to FIG. 5A, the ceramic susceptor 300 is a modification of the ceramic susceptor 100 of FIG. 2 and the ceramic susceptor 200 of FIG. 4A. The ceramic susceptor 300 includes a hollow shaft 120 with a groove 127. The ceramic susceptor 300 may be configured to additionally have the groove 127 at the lowermost end surface of the hollow shaft 120 in the ceramic susceptor 100 of FIG. 2 or the ceramic susceptor 200 of FIG. 4A.

In some cases, the ceramic susceptor 300 may be configured to include the electrode rod 121 or 123 along with the hollow shaft 120 having the groove 127, in place of the electrode rod 121 in the side wall hole 125 of the ceramic susceptor 100 of FIG. 2 or in place of the power supply conductor socket 150 and the electrode rod 123 of the susceptor 200 of FIG. 4A.

As illustrated in FIG. 5A, each electrode rod 121 or 122, which supplies power to the electrode 112 or 114, may be accommodated in the hollow 129 or a side wall hole 125 of the shaft 120, may extend to the outside through the mount 140.

Along with this, the side wall hole 125 may be provided with a rigid rod-shaped electrode rod 121. Alternatively, the side wall hole 125 may also be provided with an electrode rod 123 having a gas flow path 123-1 and gas hole(s) 123-2. The rigid rod-shaped electrode rod 121 and the electrode rod 123 with the gas flow path 123-1 and gas hole(s) 123-2 may coexist or only one of them may be provided.

The mount 140 includes a gas supply flow path 145 provided within the body 141. The gas supply flow path 145 may be a through-hole formed in the rigid portion of the body 141 or a separate member mounted in the internal space in the form of a tube or pipe structure. The mount 140 may further include a gas connection portion 142 coupled to or integrated with the body 141. The gas supply flow path 145 is in communication with the groove 127 of the hollow shaft 120.

Figure 5B:
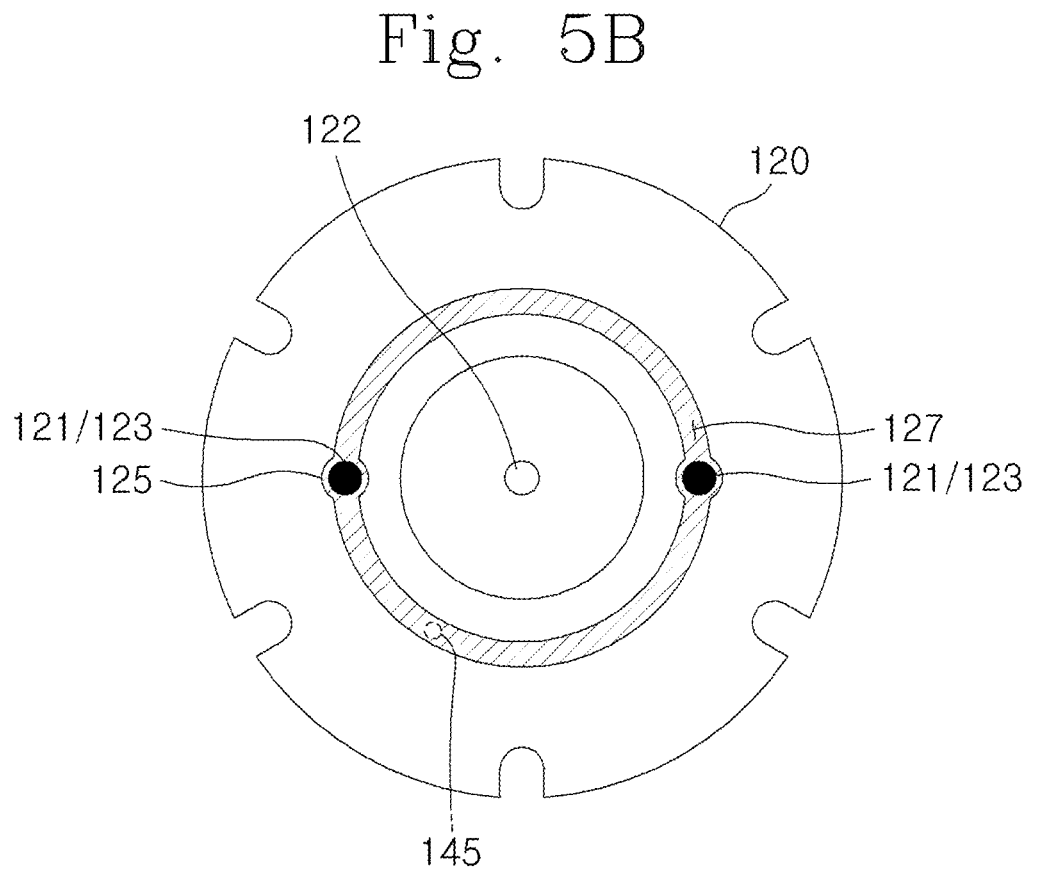

FIG. 5B is a view of the surface C-D of the hollow shaft 120 to which the mount 140 is coupled, as seen from below in FIG. 5A.

Referring to FIG. 5B, the groove 127 is formed on the lower end surface of the hollow shaft 120 to be recessed relative to the plane of the lower end surface. The groove 127 is in communication with the gas supply flow path 145 and may be a loop-shaped groove formed continuously in the circumferential direction. The groove 127 may extend to meet the side wall holes 125 at least once, and one or more electrode rods 121 or 123 in the side wall holes 125 may pass through the groove 127 and extend to penetrate the mount 140.

As a result, a gas tube for supplying an inert gas (e.g., He or $N_2$) may be connected to the gas connection portion 142, and the gas supplied to the groove 127 through the gas supply flow path 145 in communication with the gas tube may flow along the electrode rods 121 or 123 passing through the groove 127 and may be supplied to the side wall holes 125.

For example, when rigid electrode rods 121 (see FIG. 2) passes through the groove 127, the gas may flow into the side wall holes 125 through the gap between the side wall hole 125 and the electrode rod 121, thereby supplying the gas to the side wall holes 125. Alternatively, when the electrode rods 123 each having the gas flow path 123-1 and the gas hole(s) 123-2 (see FIG. 4C) passes through the groove 127, the gas may flow into the side wall holes 125 through the gap between the side wall holes 125 and the electrode rods 121. In addition, the gas may flow along the gas flow paths 123-1 within the electrode rod 123 and may be supplied to the side wall holes 125 through the gas hole(s) 123-2.

The provision of such an inert gas to the side wall holes 125 has the effect of preventing the oxidation of the electrode rods 121 or 123 even in a high-temperature environment when performing a necessary semiconductor process while supporting a target substrate 11 on the insulating plate 110.

Along with the oxidation prevention effect as described above, the ceramic susceptors 100, 200, and 300 of the present disclosure may easily prevent the risk of physical short circuits between the electrodes 121 by arranging the electrode rods 121 in the side wall holes (e.g., Φ3 to Φ6) 125 of the hollow shaft 120, thereby eliminating the space in which the electrodes 121 shake or bend. In addition, the arrangement of the electrode rods 122 inside the hollow 129 of the hollow shaft 120 may be combined with the arrangement of the electrode rods 121 or 123 in the side wall holes (e.g., Φ3 to Φ6) 125 of the hollow shaft 120. This combination allows for flexible design of the arrangement of electrodes 112 or 114, depending on changes in the number or positions of the electrode rods 121, 122, or 123, and enables the arrangement of a greater number of electrode rods 121, 122, or 123. In addition, by arranging the electrode rods 121 or 123 in the side wall holes (e.g., Φ3 to Φ6) 125 of the hollow shaft 120, the insulation of the hollow shaft 120 is utilized to make it unnecessary to provide separate insulating coatings for respective electrode rods 121 or 123. In addition, by separating the radio frequency electrode rods and the heater electrode rods within the side wall holes 125 of the hollow shaft 120 or arranging them separately in the side wall holes 125 and the hollow 129, the spacing between the rods does not narrow, thereby preventing arcing.

Furthermore, in the ceramic susceptors 100, 200, and 300 of the present disclosure described above, when the electrode rods 122 in the hollow 129 are used as radio frequency electrode rods and the electrode rods 121 and 123 in the side wall holes 125 are used as heater electrode rods, radio frequency (RF) noise may be prevented. For example, when performing a plasma process while supporting a target substrate 11 on the ceramic susceptor 100, 200, or 300, the electrode rod 122 in the hollow 129 may be grounded, and the required power may be supplied through a radio frequency head (not illustrated) above the target substrate 11. In this case, unlike conventional methods, since grounding is achieved solely through the electrode rod 122 in the hollow 129, radio frequency current does not flow through the electrode rods 121 or 123 in the side wall holes 125, which are spaced apart from the electrode rod 122 in the hollow 129 and insulated by the ceramic material of the shaft 120. As a result, radio frequency (RF) noise may be blocked during the plasma process, thereby improving uniformity in a process such as dry etching.

In the foregoing, the present disclosure has been described based on specific details, such as concrete components, limited embodiments, and drawings, but these have been provided merely to aid a more comprehensive understanding of the present disclosure, and the present disclosure is not limited to the above-described embodiments. Various modifications and alterations may be made without departing from the essential characteristics of the present disclosure by a person ordinarily skilled in the art to which the present disclosure pertains. Therefore, the spirit of the present disclosure should not be limited to the described embodiments, and not only the appended claims, but also all technical ideas that are equivalent or have equivalent modifications to the claims should be construed as being included within the scope of the present disclosure.

What is claimed is:

1. A ceramic susceptor comprising:
an insulating plate in which one or more electrodes are arranged;
a hollow shaft with one end connected to the insulating plate; and
one or more electrode rods connected to the one or more electrodes,
wherein the hollow shaft comprises one or more side wall holes penetrating an interior of a side wall,
wherein the one or more electrode rods comprise one or more first electrode rods, each of which has one end electrically connected to a first electrode among the one or more electrodes, the one or more first electrode rods extending through the one or more side wall holes, respectively, and
wherein the one or more first electrode rods each comprise a gas flow path formed of an internal empty space configured to introduce gas from another end, and one or more gas holes in communication with the gas flow path.

2. The susceptor of claim 1, wherein the one or more electrode rods further comprise one or more second electrode rods, each of which is connected to a second electrode among the one or more electrodes, the one or more second electrode rods extending through a hollow of the hollow shaft.

3. The ceramic susceptor of claim 2, wherein the first electrodes each comprise a heater electrode, and the second electrodes each comprise a radio frequency electrode.

4. The ceramic susceptor of claim 3, wherein multiple first electrode rods are respectively connected to terminals of the heater electrodes.

5. The ceramic susceptor of claim 2, wherein the first electrodes each comprise a radio frequency electrode, and the second electrodes each comprise a heater electrode.

6. The ceramic susceptor of claim 5, wherein multiple second electrode rods are respectively connected to terminals of the heater electrodes.

7. The ceramic susceptor of claim 1, further comprising:
a conductive socket coupled to the one or more electrode rods and configured to supply power,
wherein the conductive socket comprises a gas supply flow path configured to communicate with the gas flow path.

8. The ceramic susceptor of claim 1, further comprising:
a mount coupled to a lower portion of the hollow shaft.

9. The ceramic susceptor of claim 8, wherein the hollow shaft comprises a groove formed on a surface coupled to the mount and extending to meet the side wall holes at least once,
wherein the mount comprises a gas supply flow path configured to communicate with the groove, and
wherein the one or more first electrode rods pass through the groove.

10. The ceramic susceptor of claim 8, wherein the one or more electrode rods further comprise one or more second electrode rods, each of which is connected to a second electrode among the one or more electrodes, the one or more electrode rods extending through a hollow of the hollow shaft, and
wherein the one or more second electrode rods extend through the mount.

11. A ceramic susceptor comprising:
an insulating plate in which one or more electrodes are arranged;
a hollow shaft with one end connected to the insulating plate; and
one or more electrode rods connected to the one or more electrodes,
wherein the hollow shaft comprises a side wall and a plurality of convex portions that are convex radially inward from an inner surface of the side wall, and side wall holes penetrating the side wall and respectively disposed in each of the plurality of convex portions,
wherein the one or more electrode rods comprise a plurality of first electrode rods, and
wherein each of the plurality of first electrode rods has one end electrically connected to a first electrode among the one or more electrodes, and extends through each of the side wall holes.

12. The ceramic susceptor of claim 11, further comprising a mount coupled to a lower portion of the hollow shaft,
wherein the hollow shaft comprises a groove formed on a surface coupled to the mount and extending to meet the side wall holes at least once, and the mount comprises a gas supply flow path configured to communicate with the groove.

* * * * *